United States Patent [19]
Jin et al.

[11] Patent Number: 5,244,868
[45] Date of Patent: Sep. 14, 1993

[54] METHOD OF MAKING HIGH $T_c$ SUPERCONDUCTOR MATERIAL, AND ARTICLE PRODUCED BY THE METHOD

[75] Inventors: Sungho Jin, Millington; Shohei Nakahara; Thomas H. Tiefel, both of North Plainfield, all of N.J.

[73] Assignee: AT&T Bell Laboratories, Murray Hill, N.J.

[21] Appl. No.: 780,555

[22] Filed: Oct. 15, 1991

Related U.S. Application Data

[63] Continuation of Ser. No. 442,285, Nov. 28, 1989, abandoned.

[51] Int. Cl.$^5$ .................................. H01L 39/12
[52] U.S. Cl. .................................. 505/1; 505/725; 505/780
[58] Field of Search .................. 505/1, 725, 780

[56]         References Cited
        U.S. PATENT DOCUMENTS 5,024,992  6/1991 Morris ......................... 423/604

FOREIGN PATENT DOCUMENTS 0299796  1/1989 European Pat. Off. .

OTHER PUBLICATIONS

Morris et al., "Stability of 124,123, and 247 Superconductors," *Physica C* vol. 159, 1989, pp. 287–294.
Morris et al., "Bulk Synthesis and Thermodynamic Stability of the 1-2-4 and 2-4-7 Superconductors ...," Preprint Jan. 29, 1989.
Olekhnovich et al., "High–Temperature Superconductivity in the $YBa_2Cu_xO_{4+x-\delta} System$," *Vestsi ANB-SSR SF-Mat. Navuk* No. 6, 1987, pp. 47–50.
Ohta et al., "Preparation and High Tc Superconductivity of Ba-Y-Cu Oxides", *J.J.A.P.* vol. 26, No. 5, May 1987, pp. L818–L819.
Tajima et al., "Composition Dependence of . . . the Superconducting Y–Ba–Cu–O System," *J.J.A.P.* vol. 26, No. 5, May 1987, pp. L845–L847.

Kemezis, Paul, "AT&T Overcomes Another Superconducting Hurdle," *New Tech. Week*, 8 Jan. 1990.
Hatano et al., "Identification of Phases in High Tc Oxide Superconductor $Ba_{0.7}Y_{0.3}Cu_1O_x$" *J.J.A.P.* vol. 26, No. 4, Apr. 1987, pp. L374–L376.
Jin et al., "High Critical Currents in Y-Ba-Cu-O Superconductors", *App. Phys. Lett.* vol. 52, No. 24, 13 Jun. 1988, pp. 2074–2076.

(List continued on next page.)

Primary Examiner—Michael Lewis
Assistant Examiner—Steven Bos
Attorney, Agent, or Firm—Eugen E. Pacher

[57]            ABSTRACT

The disclosed method can produce high $T_c$ superconductor material e.g., $YBa_2Cu_3O_7$) of substantially increased intra-grain critical current density ($J'_c$), as compared to conventionally produced bulk material of analogous composition. Exemplarily, $YBa_2Cu_3O_7$ pellets produced according to the invention had $J'_c$ of about $10^5$ A/cm$^2$ at 77 K. in an applied magnetic field of 0.9 Telsa. The inventive method comprises providing a precursor material whose composition differs from that of the desired superconductor with respect to at least one of the metal constituents of the desired superconductor. It further comprises heating the precursor material above the decomposition temperature ($T_d$) of the precursor material such that a multiphase material results. The multiphase material comprises, in addition to a majority first phase, a dispersed precipitate phase. The method further comprises cooling the multiphase material to a temperature below $T_d$ at a rate such that at least a major portion of the precipitate phase is retained. The first phase differs from the desired superconductor at most with regard to oxygen content, and the heat treatment of the multiphase material is carried out such that the desired superconductor results. Exemplarily, the desired superconductor is $YBa_2Cu_3O_7$, the precursor material has average composition $YBa_2Cu_4O_z$ ($z \sim 8$), the precipitate phase comprises one or more copper oxides, $T_d$ is about 860° C., and the multiphase material is produced at 920° C.

7 Claims, 3 Drawing Sheets

OTHER PUBLICATIONS

Jin et al., "Fabrication of Dense $Ba_2YCu_3O_{7-\delta}$ Superconductor Wire by Molten Oxide Processing", *App. Phys. Lett* vol. 51, No. 12, 21 Sep. 1987, pp. 943–945.

Karpinski et al., "Bulk Synthesis of the 81-K Superconductor $YBa_2Cu_4O_8$ ...", Nature Dec. 1988.

Rao et al, "Superconductivity Studies on ... The Y–Ba–Cu–O System," *J.J.A.P.* vol. 26, Supplement 26-3 (1987).

Oka et al, "Phase-Equilibrium Diagram in ... $Y_2O_3$–BaO–CuO," *JJAP* vol. 27, No. 6, Jun. 1988, pp. L1065–L1067.

Karpinski et al., "The Nonstoichiometry of ... $Y_2Ba_4Cu_7O_{15\pm x}$," *Physica L* 161, Dec. 15, 1989, pp. 618–625.

Jin et al., "Large Magnetic Hysteresis in Melt-Textured Y–Ba–Cu–O Superconductor," *Appl. Phys. Lett.* vol. 54, No. 6, 6 Feb. 1989, pp. 584–586.

European Search Report, The Examiner, J. L. Harbron, The Hague, Apr. 29, 1991.

"Possible High $T_c$ Superconductivity in the Ba–La–Cu–O System", by J. G. Bednorz et al., *Z. Phys. B—Condensed Matter*, 64, 189–193 (1986).

"Superconductivity at 93K in a New Mixed-Phase Y–Ba–Cu–O Compound System at Ambient Pressure", by M. K. Wu et al., *Physical Review Letters*, vol. 58, No. 9, 2 Mar. 1987, pp. 908–910.

"Bulk Superconductivity at 91 K in Single-Phase Oxygen-Deficient Perovskite $Ba_2YCu_3O_9-\delta$", by R. J. Cava, *Physical Review Letters*, vol. 58, No. 16, pp. 1676–1679, Apr. 20, 1987.

"New Superconducting Cuprate Perovskites", by D. W. Murphy et al, *Physical Review Letters*, vol. 58, No. 18, 4 May 1987, pp. 1888–1890.

"Superconductivity in the Rare-Earth-Free Tl–Ba–Cu–O System Above Liquid-Nitrogen Temperature", by Z. Z. Sheng et al., *Nature*, vol. 332, 3 Mar. 1988, pp. 55–58.

"A New High-$T_c$ Oxide Superconductor Without a Rare Earth Element", by H. Maeda et al., *Japanese Journal of Applied Physics*, vol. 27, No. 2, Feb. 1988, pp. L209–L210.

"High Critical Currents in Y–Ba–Cu–O Superconductors", by S. Jin et al., *Applied Physics Letters*, vol. 52 (24), 13 Jun. 1988, pp. 2074–2076.

"Critical Currents Near $10^6$ A $cm^{-2}$ at 77K in Neutron-Irradiated Single-Crystal $YBa_2Cu_3O_7$", by R. B. van Dover, *Nature*, vol. 342, 2 Nov. 1989, pp. 55–57.

"Low-resistivity Contacts to Bulk High $T_c$ Superconductors", by S. Jin et al., *Applied Physics Letters*, vol. 54 (25), 19 Jun. 1989, pp. 2605–2607.

Superconductor Applications: SQUIDs and Machines, edited by B. B. Schwartz and S. Fonder, Plenum Press, New York and London, 1977.

Superconductor Materials Science—Metallurgy, Fabrication, and Applications, edited by S. Foner and B. B. Schwartz, Plenum Press, New York and London, 1981.

"Magnetization of High-Field Superconductors", by C. P. Bean, *Reviews of Modern Physics*, Jan. 1964, pp. 31–39.

METHOD OF MAKING HIGH $T_c$ SUPERCONDUCTOR MATERIAL, AND ARTICLE PRODUCED BY THE METHOD

This application is a continuation of application Ser. No. 07/442285, filed on Nov. 28, 1989, now abandoned.

FIELD OF THE INVENTION

This invention pertains to the field of high temperature superconductors. More particularly, it pertains to method of making an article that comprises such superconductor material, and to an article produced by the method.

BACKGROUND OF THE INVENTION

The discovery of superconductivity in the La-Ba-Cu-oxide system (J. G. Bednorz and K. A. Muller, *Z. Physik B-Condensed Matter*, Vol. 64, pp. 189-193, 1986) precipitated worldwide activity that very soon resulted in the discovery of other classes of oxide superconductors. See, for instance, M. K. Wu et al., *Phys. Rev. Letters*, Vol. 58(9), pp. 908-910 (1987); R. J. Cava et al., *Phys. Rev. Letters*, Vol. 58(16), pp. 1676-1679 (1987); D. W. Murphy et al., *Phys. Rev. Letters*, Vol. 58(16), pp. 1888-1890, 1987; Z. Z. Sheng et al., *Nature*, Vol. 332, pp. 55-58 1988; H. Maeda et al., *Japanese Journal of Applied Physics*, Vol. 27(2), pp. L209-L210, 1988; and U.S. patent applications Ser. Nos. 160,799 and 155,330, the former now U.S. Pat. No. 4,880,771, the latter now abandoned all incorporated herein by reference.

Although many of the newly discovered oxide superconductors have transition temperature ($T_c$) above liquid nitrogen temperture (77 K.) and thus offer promise for widespread technological use, it was soon realized that significant problems have to be overcome before these novel materials can find substantial commercial application. In particular, it was found that bulk samples of the materials typically have a relatively low critical current density ($J_c$). For instance, conventional bulk samples of $YBa_2Cu_3O_7$ typically have a $J_c$ of the order of $10^3$ A/cm$^2$ at 77 K. and in zero applied magnetic field, and still substantially lower in an applied magnetic field. Such a $J_c$ is generally considered to be too low for most applications.

There are at least two problems that contribute to the observed low values of $J_c$ in conventional bulk samples of high $T_c$ (by "high $T_c$" we mean generally $T_c \geq 30$ K., preferably $>77$ K.; by "$T_c$" we means the highest temperature at which the D.C. resistance is zero to within experimental limits) oxide superconductors. (It will be appreciated that bulk samples consist of many superconductor grains or crystallites that are packed to form a relatively dense body). One of the two problems is the so-called "weak link" problem. This pertains to the relatively low value of current that can flow without resistance from one superconductor grain to an adjoining one. This current will be referred to as the "inter-grain" current. The other is the so-called "flux flow" problem. This pertains to the relatively low current that can flow essentially without resistance within a given superconductor grain, due to weak flux pinning. The relevant critical current density will be referred to as the "intra-grain" critical current density and will be designated herein as $J'_c$. It will be appreciated that low values of critical current density are not an inherent property of high $T_c$ oxide superconductors since, for instance, current densities of the order of $10^6$ A/cm$^2$ have been observed in thin films of $YBa_2Cu_3O_7$.

Significant progress towards solution of the weak link problem has already been made. See S. Jin et al., *Applied Phys. Letters*, Vol. 52(24), pp. 2074-2076, 1988; S. Jin et al., *Applied Physics Letters*, Vol. 54(6), pp. 584-586, 1989; and U.S. patent application Ser. No. 126,083, now U.S. Pat. No. 5,011,823, all incorporated herein by reference. The progress resulted from the discovery of so-called "melt-textured growth" (MTG), a processing technique that comprises melting and oriented solidification of the superconductor material, resulting in highly textured material that can sustain significantly higher current densities than conventionally prepared bulk material. Bulk samples of $YBa_2Cu_3O_7$, prepared using MTG, have exhibited critical current densities up to about $10^4$ A/cm$^2$ at 77 K. in an applied field of 1 Tesla.

Recently progress has also been made in overcoming the flux-flow problem, when it was shown that irradiation of a single crystal of $YBa_2Cu_3O_7$ with fast neutrons can raise $J_c$ of the single crystal to about $6 \times 10^5$ A/cm$^2$ at 77 K. and 0.9 Tesla (R. B. van Dover et al., *Nature*, Vol. 342, pp. 55-57, Nov. 5, 1989). However, neutron irradiation of bulk samples of superconductor would be a relatively costly and inconvenient technique for achieving high $J'_c$ in commercial applications. Thus, the need still exists for finding a method that can be used to produce material with improved intra-grain critical current density $J'_c$, i.e., that can result in material with improved flux pinning. This application discloses such a method.

As is well known, the high $T_c$ oxide superconductors that are of relevance to this application are so-called "type II" superconductors. In type II superconductors, for magnetic fields (H) between $H_{c1}$ and $H_{c2}$, magnetic flux lines partially penetrate the superconductor but do not destroy superconductivity ($H_{c1}$ and $H_{c2}$ are the lower and upper critical fields, respectively). It is desirable that the flux lines are strongly "pinned" in the material for $H_{c1} < H < H_{c2}$, since flux line movement results in energy dissipation and electrical resistance. Thus, as is well known, it is necessary to provide strong flux pinning in the material if high $J'_c$ is desired.

In conventional (low $T_c$ type II superconductors) it is known that microscopically fine defects can serve as effective pinning sites, especially if the size scale of the defects is on the order of the superconducting coherence length of the material. However, no technique (other than, possibly, irradiation with fast neutrons) for introducing effective pinning sites into high $T_c$ (oxide) superconductors is known to the art.

As is known to those skilled in the art, intra-grain critical current density in type II superconductors can be estimated by means of the so-called "Bean model" (see C. P. Bean, *Reviews of Modern Physics*, Vol. 36, p. 31, 1964). The model expresses the intra-grain critical current density $J'_c$ as follows:

$$J'_c = 30 \times \Delta M/d,$$

where $J'_c$ is in A/cm$^2$, $\Delta M$ is the measured magnetization difference (in emu/cm$^3$) between increasing and decreasing applied magnetic field in a magnetization hysteresis measurement, and d is the average grain size in cm. The grain size is typically determined by standard metallographic techniques using optical or scanning electron microscopy.

SUMMARY OF THE INVENTION

In a broad aspect the invention is a method of producing an article that comprises superconductive oxide material of improved properties, including improved intra-grain critical current density.

The method comprises forming a multiphase material that comprises as a majority phase a material whose nominal composition differs from that of the desired superconductive oxide material at most with regard to oxygen content, and which further comprises a precipitate phase that is finely dispersed throughout all, or at least a substantial portion, of the majority phase.

More particularly, the inventive method of producing an article comprises providing an appropriate precursor material, heat treating the precursor material such that the multiphase material is formed, and the multiphase material such that the desired superconducting oxide material with the dispersed phase therein results, and optionally carrying out one or more further steps towards completion of the article. It is generally not necessary that all of the precursor material be converted to the desired superconductor and the precipitate phase. Frequently the multiphase material will comprise some left-over precursor material.

The desired superconducting oxide material has nominal composition $M_x M'_y \ldots O_z$, where M, M', ... are metal elements and x, y, ... z are appropriate positive numbers (not necessarily all integers). Exemplarily, the desired superconductor material has the nominal formula (RE) $Ba_2Cu_3O_z$ ($z \sim 7$), where RE is one or more of the rare earths Y, Dy, Gd, Yb, Eu, Nd, Sm, Ho, Er, Tm, La, or Lu. This material will be referred to as "1-2-3" material.

Significantly, the precursor material differs in its stoichiometry from the desired superconducting oxide material at least with regard to a first metal element, which typically is present in the former in greater proportion than in the latter. Furthermore, the precursor material has average composition essentially corresponding to a chemical compound. Exemplarily, the precursor material is (RE) $Ba_2Cu_4O_z$, ($z \sim 8$) or (RE) $Ba_2Cu_{3.5}O_z$ ($z \sim 7.5$). The former will be referred to as "1-2-4" material, and the latter as "1-2-3.5" material.

Heat treating the precursor material is carried out such that the multiphase material is formed from the precursor material, with the precipitate phase comprising the first metal element, and with at least a substantial portion of the precipitate (and/or left-over precursor material) present within crystal grains of the first phase material. Exemplarily, the precipitate is an oxide of the first metal, e.g., CuO or another copper oxide, and the left over precursor is 1-2-3.5 or 1-2-4.

In a currently preferred embodiment of the inventive method the precursor material is selected to have a decomposition temperature $T_d$ lower than the melt temperature ($T_m$) of the majority first phase, and the method comprises maintaining the precursor material at a temperature above $T_d$ (but below $T_m$) for an effective time for forming the dispersed precipitate phase, such that the multiphase material results. Typically, this temperature is at least about 10° C., preferably at least about 30° C., above $T_d$. Typically, the time is in the range 0.1 minutes to 100 hours, preferably 1 minute to 10 hours, depending on the temperature, as will be appreciated by those skilled in the art. The above typical ranges are chosen for the sake of convenience in industrial processing and are not necessarily of fundamental significance.

The preferred embodiment further comprises lowering the temperature of the multiphase material below $T_d$ at an effective rate for retaining at least a substantial portion of the dispersed precipitate phase. Exemplarily, the cooling rate is in the range 5° C./minute–500° C./minute. Typically the preferred embodiment also comprises slow cooling (not excluding one or more soaks at an intermediate temperature or temperatures) in an oxygen-containing atmosphere, such that the desired superconductive oxide material results from the majority first phase. It will be understood that in some cases the first phase may have essentially the same oxygen content as the desired superconductive oxide, and thus may be identical with the desired superconductor. This may, for instance, be the case if the desired superconductor does not significantly lose oxygen at the relevant processing temperatures. Exemplary of such superconductors is 1-2-4.

The inventive method can be used to produce bulk high $T_c$ oxide superconductor bodies that have intragrain critical current density ($J'_c$) substantially higher (typically by at least factors of 2, 5, or even 10) than is attainable in prior art, unirradiated bulk samples of the desired superconductor.

Exemplarily, the precursor material consists essentially of 1-2-4 material (another exemplary precursor compound is 1-2-3.5), the first phase has nominal composition $YBa_2Cu_3O_{7-\delta}$, the desired superconducting oxide has nominal composition $YBa_2Cu_3O_7$, $T_d$ is about 860° C., the multiphase material is formed at about 900° C., and the multiphase material is cooled to a temperature below $T_d$ at a rate in the approximate range 10°–100° C./minute. Exemplary inventive bulk bodies exhibited $J'_c$ of the order of $10^5$ A/cm$^2$ at 77 K. in an applied field of 0.9 Tesla, which is more than ten times the value of $J'_c$ observed in a prior art bulk body of $YBa_2Cu_3O_7$ under the same conditions.

DETAILED DESCRIPTION OF SOME PREFERRED EMBODIMENTS

The invention is expected to be broadly applicable to oxide superconductors. Practice of the invention requires substantially only the existence of an appropriate precursor compound that can be caused to decompose (at a temperature that is lower than the decomposition temperature and/or melting temperature of the majority first phase material) into a multiphase material that comprises first phase material and, finely dispersed therein, a precipitate phase, with the first phase material being the desired superconductor, or being transformable into the desired superconductor by an appropriate heat treatment. However, for the sake of definiteness and ease of exposition, the discussion below will be primarily in terms applicable to 1-2-3 material as the desired oxide superconductor. In the most commonly used 1-2-3 material RE is Y. Since other 1-2-3 materials are known to behave very similarly to $YBa_2Cu_3O_z$ ($z \sim 7$), results obtained with $YBa_2Cu_3O_z$ generally can be directly applied to any other 1-2-3 material.

An important aspect of the inventive method is the choice of precursor material. The precursor material may or may not be a superconductor. For instance, 1-2-4 material and 1-2-3.5 material can both be superconductive, with $T_c$ of 70-80 K. and about 50 K. respectively. However, if insufficiently oxidized 1-2-4 and 1-2-3.5 material can have lower $T_c$ or be non-superconducting, while still being useful as precursor material. Furthermore, in principle precursor material that is not a superconductor at all can also be useful in the practice of the invention. It will be appreciated that a superconductor such as 1-2-4 (especially Ca-substituted 1-2-4) potentially can be the desired superconductor, as well as being a possible precursor for 1-2-3 material.

Typically, the precursor material consists essentially of a stoichiometric (except possibly with regard to oxygen) chemical compound (or compounds) that decomposes above the decomposition temperature $T_d$ into the multiphase material. The latter comprises the majority first phase which has a composition which differs from that of the desired superconductor at most with regard to oxygen content. The multiphase material further comprises a finely dispersed precipitate phase.

As will be evident to those skilled in the art, both the first phase and the precipitate phase are required to be substantially stable over some temperature range above $T_d$. It will also be evident that many of the general temperatures referred to herein are not exactly defined (in the sense a melting temperature of a compound is defined) but instead are kinetically determined. For instance, $T_d$ herein is a temperature at which decomposition of the precursor compound occurs at an industrially acceptable rate, e.g., such that about 90% of the precursor decomposes in less than 24 hours.

Figure 1:
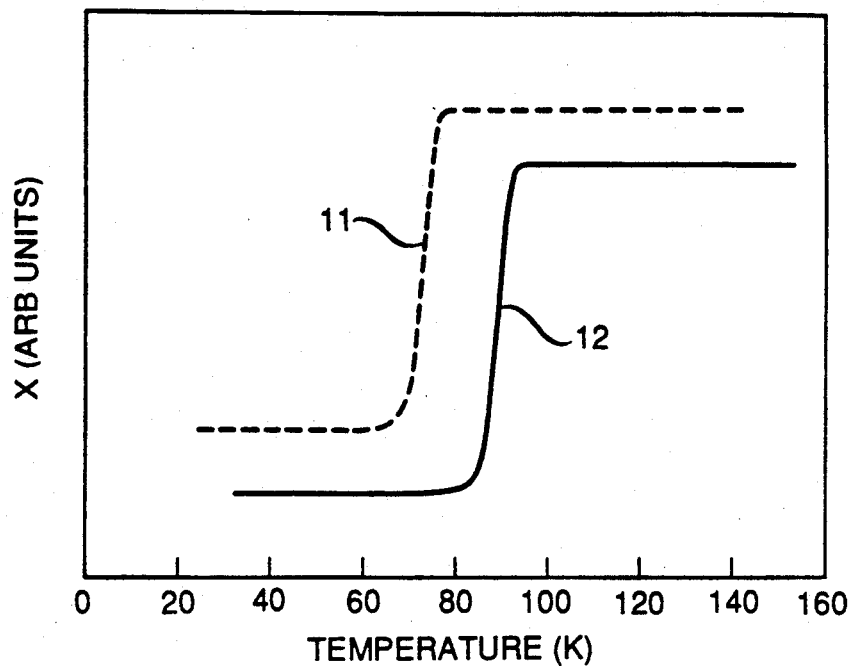
FIG. 1 shows exemplary data on the temperature dependence of the A.C. magnetic susceptibility of a pellet of 1-2-4 precursor material, and of the same pellet after decomposition and heat treatment in oxygen according to the invention.
Figure 2:
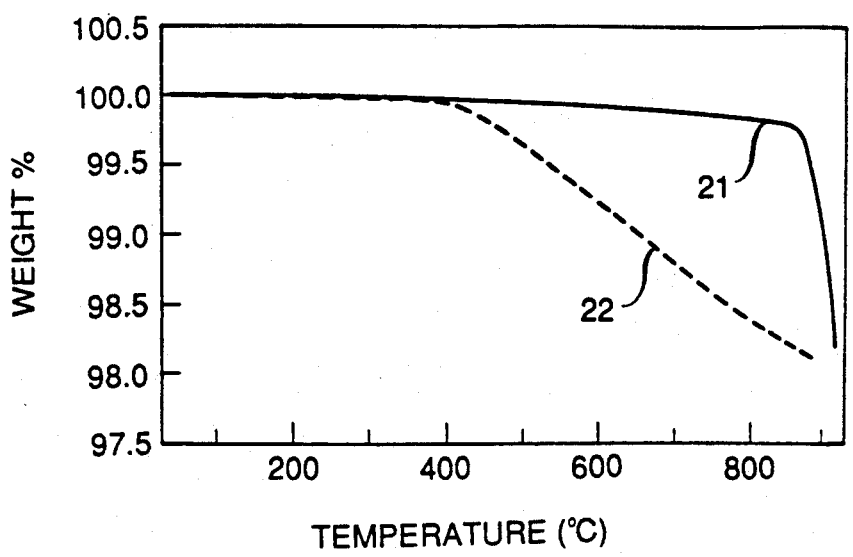
FIG. 2 gives exemplary weight loss data for 1-2-4 and for 1-2-3 material.

If the desired superconductor has nominal composition $YBa_2Cu_3O_7$ then $YBa_2Cu_4O_z$ ($z \sim 8$) is an advantageous exemplary precursor. As is known, the 1-2-4 phase can be viewed as containing in each unit cell of the lattice an additional CuO layer, as compared to the 1-2-3 phase, and has a $T_c$ of about 70-80 K. Whereas it has been previously disclosed (see D. E. Morris et al., *Physica C*, Vol. 159, pp. 287-294, 1989) that the synthesis of 1-2-4 requires relatively high oxygen pressure (e.g., about 35 atm.), we have found that high quality 1-2-4 bodies can be synthesized even at an oxygen pressure of 1 atm. Exemplarily this is accomplished by mixing an appropriate amount of CuO (or CuO dissolved in acid) with 1-2-3 powder, grinding the mixture, forming a body, sintering it at about 810° C. (with intermediate grinding and pressing) for a total time of about 12 days in oxygen. FIG. 1 shows (curve 11) A.C. magnetic susceptibility data of thus prepared $YBa_2Cu_4O_8$, and FIG. 2 shows thermogravimetric weight loss data (curve 21) for such $YBa_2Cu_4O_8$. The latter shows decomposition of 1-2-4 material at temperatures above about 850° C. FIGS. 1 and 2 also show the corresponding data for $YBa_2Cu_3O_z$ ($z \sim 7$) produced by decomposition of $YBa_2Cu_4O_8$ according to the invention (curves 12 and 22, respectively).

(RE) $Ba_2Cu_4O_z$ is not the only precursor compound that can be used to produce 1-2-3-type superconductors according to the invention. (RE) $Ba_2Cu_{3.5}O_z$ is another useful precursor compound. Others will likely be found, as the relevant phase diagram is being established. Furthermore, other compounds will be useful in the production of high $T_c$ materials other than (RE) $Ba_2Cu_3O_z$.

Figure 3:
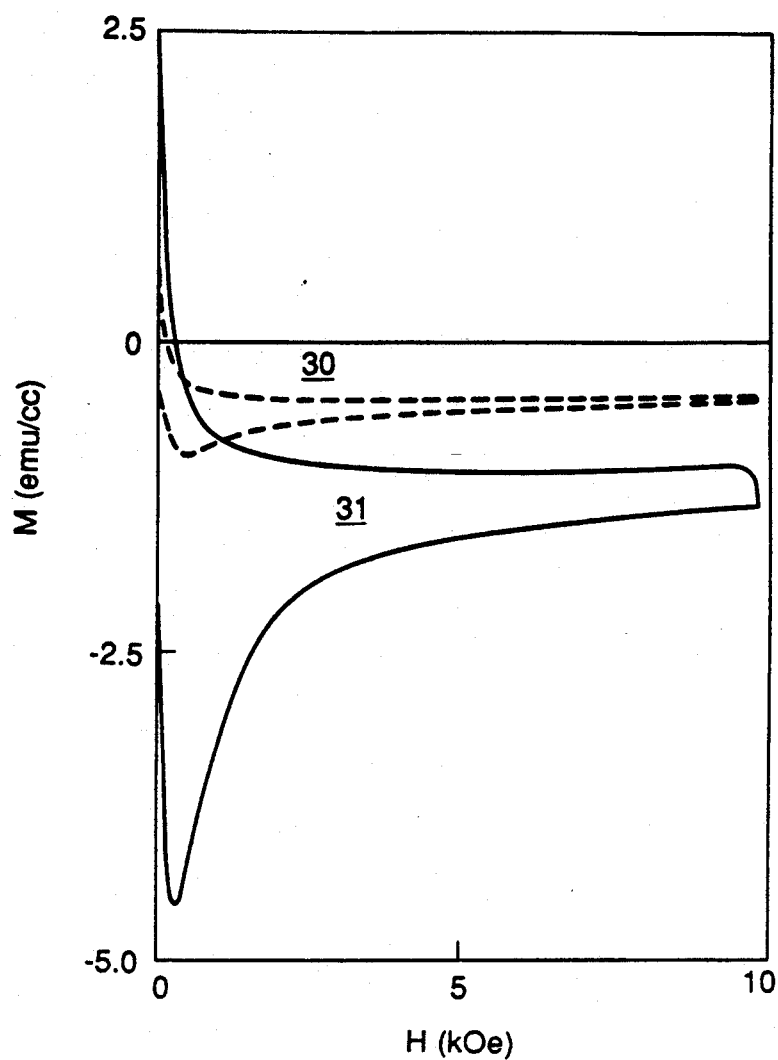
FIG. 3 shows exemplary magnetization data for material produced according to the invention and for conventionally produced 1-2-3 material.

FIG. 3 shows conventional magnetization data for material produced according to the invention (curve 31), and for conventionally produced $YBa_2Cu_3O_7$ (curve 30), with the desired superconductor in the inventive material also being $YBa_2Cu_3O_7$. Both curves show magnetic hysteresis, but the amount of hysteresis (expressible as the absolute difference in magnetization between the lower (increasing H) and upper (decreasing H) branches of the magnetization curve; this difference is designated $\Delta M$) is substantially larger in curve 31. This translates into substantially larger $J'_c$ in the inventive material, assuming that both materials have similar grain sizes (this similarity was in fact observed).

It is expected that material according to the invention can be used in essentially all applications in which prior art (high and low $T_c$) bulk superconductors have been used, or have been proposed for use.

For a general overview of some potential applications of superconductors see, for instance, B. B. Schwartz and S. Foner, editors, *Superconductor Applications: SQUIDs and Machines*, Plenum Press 1977; and S. Foner and B. B. Schwartz, editors, *Superconductor Material Science, Metallurgy, Fabrications, and Applications*, Plenum Press 1981. Among the applications are power transmission lines, rotating machinery, and superconductive magnets, for e.g., fusion generators, MHD generators, particle accelerators, levitated vehicles, magnetic separation, and energy storage, as well as junction devices and detectors.

By "bulk" superconductors we mean herein not only relatively massive bodies and elongate bodies such as wires, tape or sheet (including metal-clad or metal core superconductive wire, tape or sheet) but also "thick" films of the type produced by silk screening or similar processes (see, for instance, U.S. patent application Ser. No. 794,301, which is a continuation application of Ser. No. 368,079), now abandoned. The inventive method may also be usefully applied to thin films produced by such deposition techniques as sputtering, vapor deposition, or laser ablation, where it can further enhance flux pinning.

Bulk superconductor bodies according to the invention may comprise, in addition to the desired superconductor material and the dispersed precipitate phase (and possibly left over precursor material), other material (or materials) that is compatible with the inventive process and does not substantially poison the superconductor. Exemplary of such materials are Ag and silver oxide in the form of particles. As is known, the presence of silver particles can advantageously affect the mechanical and thermal properties of 1-2-3 material, can improve oxygen diffusion into the body, and can result in reduced contact resistance. See, for instance, S. Jin et al., *Applied Physics Letters*, Vol. 54, page 2605, (1989), and U.S. patent application Ser. No. 426,485, which is a continuation application of Ser. No. 316,544, now abandoned.

Furthermore, other phases of the relevant material system that can co-exist with the desired superconductor may be present. Exemplarily, in the Y-Ba-Cu-oxide system such phases may be $Y_2BaCuO_5$, $Y_2O_3$, $BaCuO_5$. No material is present in an amount greater than the desired superconductor, and typically the desired superconductor is at least 50% by volume of the material according to the invention.

Figure 4:
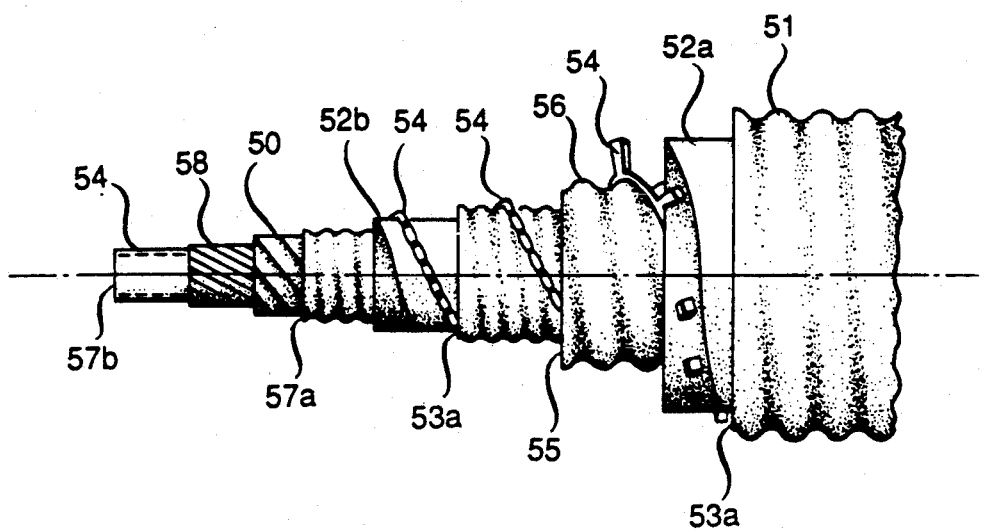
FIGS. 4–6 depict exemplary potential applications for high $T_c$ superconductor bodies produced according to the invention.
Figure 5:
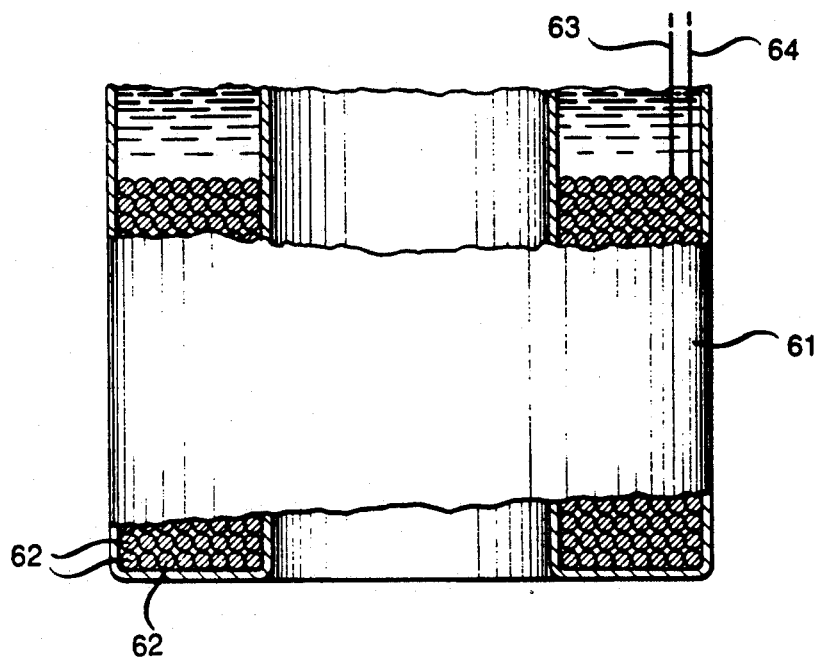
Figure 6:
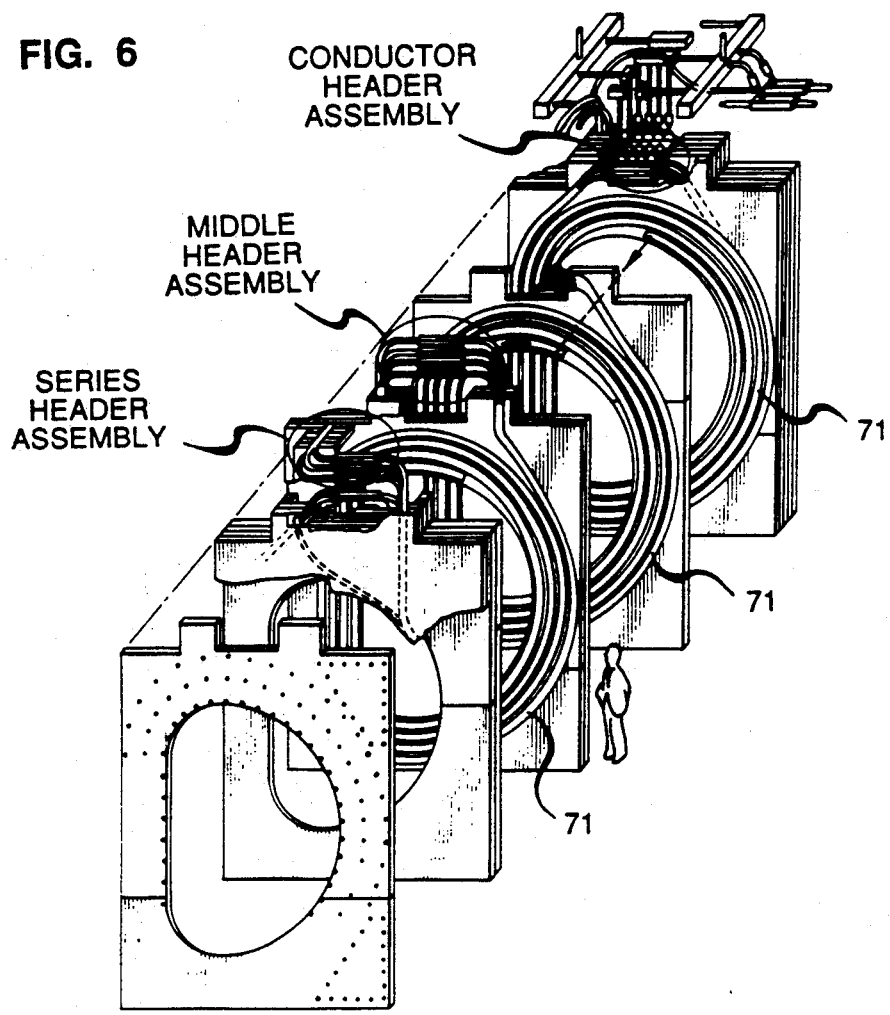

FIGS. 4-6 illustrate potential applications of superconductors according to the invention. The structure shown in FIG. 4 is described in detail in G. Bogner, "Large Scale Applications of Superconductivity", in *Superconductor Applications: SQUIDs and Machines*, B. B. Schwartz, and S. Foner, editors, (Plenum Press, New York, 1977). Briefly, the structure depicted consists of an outer sheathing 51, thermal insulation layers 52a and 52b, evacuated annular regions 53a and 53b, spacers 54, nitrogen-filled annular region 55, heat shield 56, and coolant regions 57a and 57b. Element 58 is a superconductor material in accordance with the invention. FIG. 5 shows a superconducting magnet comprising an annular cryostat 61 filled with an appropriate cryogenic liquid and containing turns 62 of a superconductive material according to the invention. Terminal leads 63 and 64 are shown emerging from the coil. The structure of FIG. 5 is described in R. A. Hein and D. U. Gubser, "Applications in the United States", in *Superconductor Materials Science: Metallurgy, Fabrication, and Applications*, S. Foner and B. B. Schwartz, editors, (Plenum Press, New York, 1981). The superconducting elements shown in FIG. 6 as windings 71 are made of a material herein. The structure of FIG. 6 is considered exemplary of those expected to find broad-scale use for containment of fusion reactions.

EXAMPLE 1

A quantity of previously prepared $YBa_2Cu_3O_7$ powder was mixed with sufficient CuO powder to result in a mixture of average composition corresponding to $YBa_2Cu_4O_x$. After further grinding, the mixture was pressed into pellets (2×3×30 mm), and the pellets heated in air to 810° C. These conditions were maintained, with several intermediate grinding and pelletizing steps, for a total of 12 days. A subsequent powder X-ray analysis of one pellet showed the material to be essentially pure 1-2-4 phase. The material had a $T_c$ of about 75 K. Several of the thus produced pellets were heated to 810° C., maintained at that temperature for 15 minutes, heated in 5 minutes to 920° C., held at that temperature for 1.5 minutes, followed by rapid cooling (total cooling time 10 minutes) to 750° C., all in flowing oxygen. The treatment resulted in substantially complete decomposition of the 1-2-4 precursor into multicomponent material (containing 1-2-3 material and finely dispersed copper oxide), with at least a major portion of the dispersed copper oxide retained during the rapid cool-down. After the rapid cool-down to 750° C. the pellets were slowly cooled in flowing oxygen to below 380° C. at 25° C./hour to adjust the oxygen stoichiometry of the 1-2-3 material. Transmission electron microscopy revealed the presence of many fine copper oxide particles, (typically 100-400 nm in diameter) and a high density of defects in the 1-2-3 phase surrounding the particles.

AC magnetization measurements showed that the thus produced multiphase material had $T_c$ of about 90 K., and X-ray diffraction analysis showed the presence of essentially only $YBa_2Cu_3O_7$ peaks and CuO peaks. Magnetization measurements at 77 K. resulted in the data presented as curve 31 of FIG. 3. A conventional $YBa_2Cu_3O_7$ pellet (produced from the same batch of 1-2-3 powder used in the above referred-to mixture, sintered at 920° C. for 8 hours, cooled at 25° C./hour to below 380° C., all in flowing oxygen) was also measured, with the results shown as curve 30 in FIG. 3. The average grain size of both materials was determined by a conventional metallographic technique. Some of the results are given in Table I, wherein "A" refers to the prior art comparison sample, and "B" to the material according to the invention.

TABLE I

| | ΔM at H = 0.9 Tesla (emu/cm³) | d (cm) | $J'_c$ at H = 0.9 Tesla (A/cm²) |
|---|---|---|---|
| A | 0.04 | $1.5 \times 10^{-4}$ | $0.8 \times 10^4$ |
| B | 0.35 | $1.0 \times 10^{-4}$ | $1.1 \times 10^5$ |

EXAMPLE 2

A pellet of multiphase superconductive material (first phase $YBa_2Cu_3O_x$) was produced substantially as described in Example 1, except that the pellet was held at 920° C. for 4 hours. The resulting material had $\Delta M=0.46$ emu/cm³, $d \sim 1.7 \times 10^{-4}$ cm, and $J'_c \sim 7.7 \times 10^4$ A/cm² at 77 K., H=0.9 Tesla.

EXAMPLE 3

A pellet was produced substantially as described in Example 2, except that the time at 920° C. was 16 hours. The resulting material had $\Delta M=0.13$ emu/cm³, $d \sim 4.3 \times 10^{-4}$ cm, and $J'_c \sim 0.9 \times 10^4$ A/cm² at 0.9 Tesla.

Examples 2 and 3 illustrate the importance of decomposition time, with long decomposition times resulting in lower $J'_c$. Typically, optimal decomposition time is a function of the temperature. For temperatures relatively close to $T_d$ it is expected that optimal decomposition times will be relatively long, whereas the times are expected to be relatively short for temperatures relatively far above $T_d$. Whereas the melting temperature $T_m$ of the lowest-melting phase of the multiphase material is certainly an upper limit on the temperature for decomposition, in some material systems one or more of the phases of the multiphase material may decompose at a temperature below $T_m$. In such systems the temperature for decomposition of the precursor material may be selected to be below any decomposition temperature associated with the multiphase material. If the desired superconductor is a 1-2-3 type material, then decomposition typically is carried out above about 860° C., preferably above about 900° C., for a time in the range 0.1 minutes to 10 hours, still more preferably 1 minute to 4 hours. Too short time and/or too low temperature can result in insufficient decomposition of precursor material, whereas too long time and/or too high temperature result in undesirable annealing out or coarsening of the flux pinning defects.

As demonstrated by Example 1, material produced according to the invention can have $J'_c$ that is substantially higher (more than an order of magnitude) than that observed in conventional high $T_c$ material of analogous composition. This improvement is attributed to enhanced flux pinning in the inventive material. The exact nature of the pinning centers is not yet fully understood. Possible pinning centers include finely dispersed CuO (or other copper oxide) precipitates, or defects associated with the precipitates, or with the formation of the precipitates, or with the decomposition process, or with left-over precursor material.

In a further exemplary embodiment the precursor material is preliminarily subjected to a MTG process (possibly at relatively high oxygen pressure) such that the precursor material has a dense, highly oriented structure, whereby the detrimental effect of weak links can be reduced. Grain orientation of precursor material can also be achieved by other means, e.g., by mechanical or magnetic field alignment, or by epitaxial growth on a substrate from a solution, melt, or vapor phase, and all such means are contemplated.

We claim:

1. Method of making an article that comprises a material comprising polycrystalline superconducting oxide composition (RE) $Ba_2Cu_3O_x$, with RE selected from the group consisting of Y, Dy, Gd, Yb, Eu, Nd, Ho, Er, Tm, La, Lu, and combinations thereof, and with $x \sim 7$; the method comprising a) providing a quantity of precursor material selected from the group consisting of oxide compositions (RE) $Ba_2Cu_{3.5}O_y$ and (RE) $Ba_2Cu_4O_z$, with y and z being approximately 7.5 and 8, respectively;

b) keeping said precursor material in an oxygen-containing atmosphere at a temperature T for a time t, where T is greater than 900° C. and a precursor material decomposition temperature $T_d$, and is less than a melting temperature $T_m$ of the superconducting oxide, and where t is in the range 1 minute to 4 hours, with T and t furthermore selected such that a multiphase material is formed from the precursor material, said multiphase material comprising as a majority phase a polycrystalline first material of composition (RE) $Ba_2Cu_3O_{x'}$ with $x' < x$, and further comprising Cu-containing precipitate particles, with at least some of said precipitate particles being dispersed within crystallites of the polycrystalline first material;

c) cooling said multiphase material to a temperature below $T_d$ at a rate effective for retaining at least some of said dispersed precipitate particles; and d) keeping said multiphase material in an oxygen-containing atmosphere at a temperature and for a time effective for transformation of at least some of said polycrystalline first material into said polycrystalline superconducting oxide, with the superconducting oxide being at least 50% by volume of the material.

2. Method of claim 1, wherein the rate of step c) is in the range 10°–100° C./minute, and wherein the temperature and time in step d) are selected such that essentially all of said first material is transformed into the superconducting oxide.

3. Method of claim 1, wherein the precursor material comprises dispersed Ag particles and/or dispersed silver oxide particles.

4. Method of claim 1, wherein step a) comprises providing a precursor material the grains of which are not randomly oriented.

5. Method of claim 1, wherein a) comprises melting and re-solidifying the precursor material, such that a textured precursor material results.

6. Method of claim 1, wherein step b) is carried out in flowing oxygen gas.

7. Method of claim 6, wherein steps b)–d) are carried out in flowing oxygen gas.

* * * * *